United States Patent [19]
Lutz et al.

[11] 3,760,194
[45] Sept. 18, 1973

[54] HIGH SPEED SENSE AMPLIFIER

[75] Inventors: Robert Clare Lutz, Sunnyvale; Jerald R. Bernacchi, Los Altos, both of Calif.

[73] Assignee: Advanced Mamory Systems, Sunnyvale, Calif.

[22] Filed: Jan. 31, 1972

[21] Appl. No.: 222,148

[52] U.S. Cl. ............ 307/235 R, 307/215, 307/217, 307/289, 330/30 D

[51] Int. Cl. ..... H03k 5/20, H03k 19/38, H03f 3/30

[58] Field of Search .................... 307/213, 214, 215, 307/218, 235 R, 217, 289, 238, 291; 328/99, 146; 330/30 D, 69

[56] References Cited

UNITED STATES PATENTS

| | | | |
|---|---|---|---|
| 3,292,014 | 12/1966 | Brooksby | 307/291 X |
| 3,417,261 | 12/1968 | Walsh | 307/217 X |
| 3,502,900 | 3/1970 | Straub | 307/218 X |
| 3,042,814 | 7/1962 | Campbell, Jr. | 307/291 X |
| 3,424,928 | 1/1968 | Priel et al. | 307/291 |
| 3,437,840 | 4/1969 | Murray et al. | 307/291 X |
| 3,514,633 | 5/1970 | Schroeder | 307/291 X |
| 3,648,061 | 3/1972 | Black et al. | 307/213 X |

OTHER PUBLICATIONS

Hunter, Handbook of Semiconductor Electronics, McGraw-Hill Co., Third Edition, 1970, P. 11-73 to 11-75.

*Primary Examiner*—John W. Huckert
*Assistant Examiner*—L. N. Anagnos
*Attorney*—Spensley, Horn & Lubitz

[57] ABSTRACT

A high speed sense amplifier particularly suited for use with ECL compatible integrated memory components. The sense amplifier is basically a two-stage amplifier having an input stage and an output stage. The input stage is a low input impedance differential current amplifier and the output stage is a differentially driven current switch typically coupled to a standard single ended ECL emitter follower output. The differential current amplifier used for the input stage responds to a low input current. The response time of the amplifier is short even in the presence of relatively high capacitance at the input terminals due to the circuitry connected thereto.

10 Claims, 2 Drawing Figures

HIGH SPEED SENSE AMPLIFIER

BACKGROUND OF THE INVENTION

1. Field of the Invention

This invention relates to the field of sense amplifiers, and particularly to sense amplifiers for detecting a differential input and providing a single ended logic compatible output.

2. Prior Art

A number of logic families are presently known, with standard logic elements in each of these families being commercially available for use in digital equipment. Such logic families include diode logic, resistor transistor logic, diode transistor logic and transistor-transistor logic. There is also available a logic family commonly referred to as emitter coupled logic (ECL); sometimes also referred to as current mode logic because of the nature in which the switching functions are accomplished. In particular, ECL logic may be generally characterized as transistor logic in which the transistors are not allowed to enter saturation, thereby avoiding the recovery time problem typically incurred as a result of saturation in some other logic families. Also, emitter coupled logic is generally characterized as a current switching logic, typically switching a substantially constant current between two alternate paths in response to a voltage or differential voltage input. This avoids large transients on power supply lines and in addition generally results in very high speed logic elements since current switching is generally accomplished at relatively low voltage differentials, e.g., the impedances associated with such circuits are characteristically quite low so as to maintain low RC time constants in the presence of element and lead capacitances.

The present invention is a high speed sense amplifier circuit which permits monolithic integration so that it may be included as part of a memory circuit and which, because of its characteristic high speed, is particularly useful with ECL logic since speed is an important consideration for each element for such circuitry. Therefore, the present invention and the prior art with respect thereto shall be described particularly with respect to ECL logic for purposes of explanation only, it being understood that changes in the circuit may be made within the spirit and scope of the invention so as to be useful with other logic families.

In prior art sense amplifiers having a differential input, each of the two input terminals on the amplifier are connected directly to the base of a respective transistor so as to provide an initial differential amplification. Since the base impedance of a transistor is characteristically high, the input terminals are also characteristically resistively coupled to a reference voltage so that the RC time constant is primarily dependent upon the value of the last named resistors rather than the base impedance of the transistors.

The above circuit may be caused to perform with reasonable speed by selecting the resistors to have relatively low value for applications wherein the differential input current will be sufficient to provide a satisfactory base voltage swing at the two input transistors. However, as the input current decreases, the value of the two resistors must be increased to maintain a minimum differential read voltage (typically approximately 200 millivolts). Consequently, the input impedance must be substantially increased in such an application, resulting in substantially increased response time. Thus, to maintain the potentially high speed of such an amplifier, the other parts of the memory circuit must be designed to deliver an adequate input current so that the resistors coupled to the bases of the input transistors may be kept relatively low. However, it should be recognized that in integrated circuit devices, there is an upper limit in the power an integrated circuit may dissipate. Thus, in a memory circuit, as the number of components (bits per package) increases, the values of the internal circuit current must decrease. Therefore, as capacity increases, the bit line currents must become smaller, thereby increasing the response time of prior art sense amplifiers. Also whenever memory capacity is increased by increasing the number of memory columns, more sense/write array interface transistors must be used, thereby increasing the total capacitance at the input terminal to the sense amplifier. Thus, it is apparent that prior art sense amplifiers may limit the memory capacity and/or speed of a memory circuit because of the limitations hereabove described.

BRIEF SUMMARY OF THE INVENTION

A high speed sense amplifier particularly suited for use with ECL compatible integrated memory components. The sense amplifier is basically a two-stage amplifier having an input stage for receiving an differential input currents, and an output stage for providing a single ended ECL compatible output. The input stage is a low input impedance differential current amplifier and the output stage is a differentially driven current switch typically coupled to a standard single ended ECL emitter follower output. The differential current amplifier used for the input stage results in a low input impedance even when used in circuits providing a low input current. Consequently, the response time of the amplifier is short even during the presence of relatively high capacitance at the input terminals due to the circuitry connected thereto. An inhibit means is provided for inhibiting the output of the sense amplifier independent of the state of the input signals without saturating any of the active components in the amplifier, thus allowing rapid recovery from the inhibit condition. The circuits of the present invention sense amplifier may be used in conjunction with either active or passive current sources and may be operated from a conventional 5 volt ECL power supply.

DETAILED DESCRIPTION OF THE INVENTION

Figure 1:
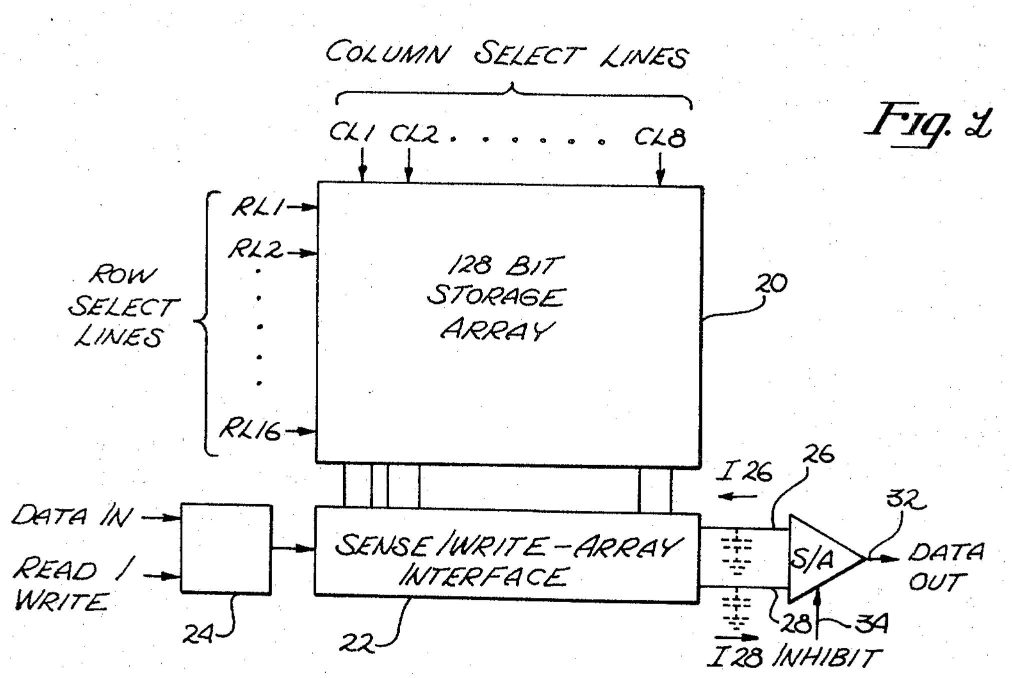
FIG. 1 is a block diagram of a typical storage array illustrating the manner in which a sense amplifier, such as the sense amplifier of the present invention is used.

First referring to FIG. 1, a block diagram of a typical sense amplifier, as it is commonly used with a memory array and array interface, may be seen. In the specific example shown, the memory array 20 is a 128 bit storage array arranged within 16 rows by 8 columns. By the selection of one row and one column through circuitry which is not shown, any of the 128 bit storage spaces may be selected for writing into or reading out of by the sense/write array interface 22. The sense/write array interface is controlled by buffer circuitry and logic 24 which provides a signal directing either a read or a write operation, and in the case of a write operation, directs the data to the interface. When a read signal is applied, a differential current output (the word output issued in the general sense, as positive current "outputs" are defined by the arrows I26 and I28 in FIGS. 1 and 2), appears on lines 26 and 28 in accordance with the logic state of the storage space selected through one of the row select lines and one of the column select lines. The differential current is sensed and amplified by a sense amplifier which is generally adapted to provide an output on line 32 which is compatible with the particular logic family being used. As previously stated, the present invention sense amplifier exhibits unusually high speed of operation, thereby making it particularly useful with ECL logic. Therefore, in the specific embodiment which is described in detail herein, the output appearing on line 32 is an ECL compatible output. A sense amplifier such as the sense amplifier 30 characteristically has an inhibit line 34 through which the output of the sense amplifier may be inhibited, independent of the differential signal appearing in lines 26 and 28. There is also shown in FIG. 1, in phantom, a capacitor on each of the input leads 26 and 28. These capacitors shown schematically are not intentionally included in the circuit but represent unavoidable capacitance between the conduction paths in the integrated circuit and the substrate. Of course, there is also some capacitance between the two leads 26 and 28, but this may be reasonably controlled by appropriate dispostion of the leads with respect to each other on the substrate.

It is to be noted that the currents I26 and I28 in lines 26 and 28, respectively, are indicated as flowing out of the sense amplifier 30. This is characteristically true for emitter coupled logic, and the recovery or response time of the sense amplifier to the application of differential currents on lines I26 and I28, is determined primarily by the input impedance of the amplifier and the amount of capacitive loading on the input line, either internal to or external to the amplifier. In the specific application for which the present invention amplifier has been used, the operation of the sense/write array interface 22 is such that during read, the output signal should be in the true state when there is a current I26 (e.g., the voltage on line 26 is less than the voltage on line 28), the output should be in the false state when there is a current I28, with currents I26 and I28 generally not occurring simultaneously. When an inhibit signal is applied to line 34 (characteristically during a write operation of the memory) the output of the sense amplifier is clamped in the false state independent of any small currents (e.g., small or signal level compared with current source 52), which may appear on lines 26 and 28. Of course, receovery time of the amplifier upon removal of the inhibit signal is also an important parameter for such a sense amplifier.

Figure 2:
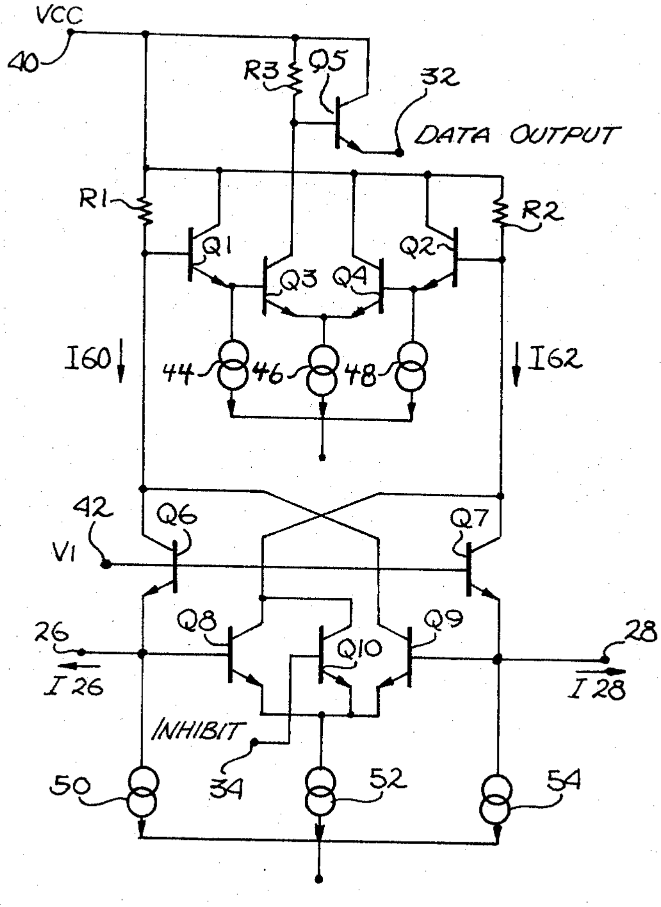
FIG. 2 is a circuit diagram of the preferred embodiment of the sense amplifier of the present invention.

Now referring to FIG. 2, a schematic diagram of the preferred embodiment of the present invention sense amplifier may be seen. In this Figure, terminal 40 is connected to a first power supply voltage, referred to herein as VCC, terminal 42 is connected to a second power supply or reference voltage $V_1$, which is somewhat lower than VCC, and the current sources 44, 46, 48, 50, 52 and 54 are each generally coupled to a still lower power supply voltage, not shown. The current sources 44 through 54 may be either passive or active sources, that is, may be each simply a high valued resistor, or may each be a transistorized current source so as to achieve an apparently higher impedance for the current and voltage drop than is achievable simply by a resistor. Such active current sources are well known in the art and therefore are not further described herein. (In this regard it should be noted that the phrase current source or current sources as used herein is used in the general sense to indicate current sources or sinks depending on what conductivity type transistors are used to fabricate the present invention amplifier. While the preferred embodiment uses NPN transistors and current sinks, PNP transistors and current sources may be used to fabricate a directly equivalent amplifier.)

The input lines 26 and 28 are the differential current input lines shown in FIG. 1. Line 26 is connected to the current source 50, to the emitter of transistor Q6 and to the base of transistor Q8. Similarly, line 28 is connected to the current source 54, the base of transistor Q9 and the emitter of transistor Q7. The bases of transistors Q6 and Q7 are coupled together and to terminal 42. The collector of transistor Q6 is coupled through resistor R1 to terminal 40 and is connected to the collector of transistor Q9. Similarly, the collector of transistor Q7 is coupled through resistor R2 to terminal 40 and is connected to the collector of transistor Q8. The collector of transistor Q8 is also connected to the collector of transistor Q10, with the emitters of transistors Q8, Q9 and Q10 all connected together and connected to current source 52. The base of transistor Q10 is connected to terminal 34, which inhibits the output of the sense amplifier upon the occurrence of an inhibit signal.

Also connected to the collectors of transistors Q6 and Q7 are the bases of transistors Q1 and Q2, respectively, with the collectors of the last two named transistors being connected to terminal 40. The emitters of transistors Q1 and Q2 are connected to current sources 44 and 48, respectively, and to the bases of transistors Q3 and Q4, respectively. The emitters of transistors Q3 and Q4 are connected together and to current source 46. The collector of transistor Q4 is connected to terminal 40 and the collector of transistor Q3 is coupled to terminal 40 through resistor R3 and is connected to the base of transistor Q5. The collector of transistor Q5 is connected to terminal 40, and the emitter of transistor Q5 is connected to terminal 32, which is the single ended output terminal for the amplifier.

The emitter base junction of transistors Q6 and Q7 serve as nonlinear load elements for the input current on lines 26 and 28. The average input impedance of the amplifier is determined by the value of the input current sources 50 and 54 and the average value of the sense current applied to the input. In particular, since the impedance, that is, the dynamic resistance of the emitter-base diode is inversely related to the emitter current, the effective input impedance of the amplifier may be decreased by increasing the values of the current sources 50 and 54.

Transistors Q8 and Q9 and current source 52 form a differential amplifier. Also, in the preferred embodiment, the circuit of the present invention will be fabricated in monolithic form with all transistors being simultaneously diffused into the substrate. Therefore, transistors Q6, Q7, Q8 and Q9 will be substantially identical, and thus their nonlinear current voltage characteristics of their emitter base junction will also be identical. In addition, it will be noted that the bases of transistors Q6 and Q7 are common as are the emitters of transistors Q8 and Q9. Similarly, the bases of transistors Q8 and Q9 are common with the emitters of transistors Q6 and Q7. Consequently, the base to emitter voltage differential between transistors Q8 and Q9 must be the same as the base to emitter voltage differential between transistors Q7 and Q6. Thus, ignoring base currents, the nonlinear characteristics of the emitter base diodes cancel, leading to the simple proportional relationship that the current in transistor Q6 divided by the current in transistor Q7 is equal to the current in transistor Q9 divided by the current of transistor Q8. The current gain of the input stage, expressible as (I60 – I62) divided by the differential input current on lines 26 and 28, is approximately 1 + I52/2I50, where I52 is the current in current source 52, I50 is the current in current source 50 (the current in current source 54 being assumed identical with the current in the current source I52).

In many applications, the sense amplifier of the present invention will not be used with a true differential input, but rather a current in line 26, with substantially zero current in line 28, will represent a true state, whereas a current in line 28 with substantially zero current in line 26 will represent the false state. In such a case the gain of the input stage will be approximately 1 + I52/(2I50 + $I_{in}$) where $I_{in}$ is the current on the appropriate input line 26 or 28.

The amplified currents I60 and I62 flow through resistors R1 and R2 respectively, creating a differential voltage between the bases of transistors Q1 and Q2. These two transistors are connected to current sources 44 and 48 so as to function as emitter followers to drive the bases of transistors Q3 and Q4 respectively. Transistors Q3 and Q4 have their emitters connected together and to current source 46 to function as a differential current switching amplifier so as to direct the current of current source 46 either downward through transistor Q3 or through transistor Q4, depending upon the input signal to the sense amplifier. Thus, with the current for current source I46 flowing through transistor Q4, there will be substantially no current through resistor R3, and therefore the base of transistor Q5 will be substantially at the positive power supply voltage applied to terminal 40. Transistor Q5 operates as an emitter follower, and when the base thereof is at the positive power supply voltage, e.g., the true state, the output at terminal 32 will be at the true state (the output will be VCC minus the base emitter diode drop in transistor Q5). When the amplifier input signal changes to the false state, transistor Q3 is turned on and conducts substantially all the current for current source I46. Thus, the voltage drop across resistor R3 causes the base of Q5 to drop to the false state. The output voltage at terminal 32 will then be VCC minus the voltage drop across R3 and minus the base emitter voltage drop of Q5. Transistor Q5 provides ECL compatibility, though obviously other output circuits may be adapted for use with the present invention sense amplifier for compatibility with other logic families. Similarly, the entire output stage generally comprised of transistors Q1, Q2, Q3, Q4 and Q5 may be altered without departing from the spirit and scope of the present invention.

The conventional ECL power supply is approximately 5 volts. In the preferred embodiment of the present invention, the voltage V1 at terminal 42 is set at approximately one-half of a volt less than VCC to prevent the saturation of transistors Q6 and Q7. The resulting voltage levels at the input lines 26 and 28 is set at one base emitter voltage drop below V1, which prevents saturation of the interface 22 (FIG. 1). The most negative circuit voltage occurs at the emitters of transistors Q8 and Q9 and is two diode drops below V1, or approximately VCC–2.1 volts. The remanining 2.9 volt drop across the current source is large enough to permit fabrication of the current sources I44 through I54 as either high valued resistors, or transistorized current devices, as hereinbefore states.

The amplifier disclosed herein provides high speed current amplification of differential current signals Further, on input lines which are heavily loaded with capacitance. FUrther, the amplifier has excellent common mode rejection characteristics, a fast and simple inhibit capability and is highly compatible with the emitter coupled by the circuits. In this regard it will be noted that transistor Q10 is connected substantially in parallel with transistor Q8 so that an inhibit signal applied to the terminal 34 will turn on transistor Q10. Thus, the application of an inhibit signal assures that the current of current source 52 does not flow through transistor Q9 but flows through one or both of transistors Q8 and Q10. This assures that the output of the sense amplifier is clamped in the false state regardless of the condition of the input on lines 26 and 28 (provided both inputs are zero or are small). It should be noted also that the maximum current through transistor Q10 is equal to the current in current source I52 so as to prevent transistor Q10 from entering saturation. Thus, a minimum recovery time is required, upon removal of an inhibit signal for the output of the sense amplifier to accurately indicate the condition of the input signal. In this regard, all of the current sources 44 through 54 are selected so as to prevent saturation of any of the transistors in the circuit, thereby preventing the long recovery time characteristic of transistors in saturation. It is to be understood also that other inhibit means may be employed. By way of example, transistor Q10, instead of being connected in circuit as shown in FIG. 2, might be connected with its emitter coupled to terminal 26 and its collector coupled to terminal 40. This scheme inhibits the amplifier rapidly, as desired, though the recovery time is substantially longer than that obtained in the inhibit means shown in FIG. 2. Similarly, other inhibit means, as well as other changes, such as the replacement of transistor Q5 with other circuitry to provide an output compatible with other logic families, may readily be incorporated into the circuits of the present invention. Thus, while the invention has been particularly shown and described with reference to preferred embodiments thereof it will be understood by those skilled in the art that various changes in form and detail may be made therein without departing from the spirit and scope of the invention.

We claim:

1. A sense amplifier for high speed memory applications comprising an input stage having first, second, third and fourth transistors of the same conductivity type, and an output stage, said first and second transistors having their bases coupled together and to a first power supply terminal and having their collectors coupled through first and second resistors, respectively, in said output stage to a second power supply terminal, said collector of said first transistor further being coupled to the collector of said third transistor and said collector of said second transistor being coupled to the collector of said fourth transistor, the emitter of said first transistor being coupled to the base of said fourth transistor, to a first input terminal, and to a first current source, the emitter of said second transistor being coupled to the base of said third transistor, to a second input terminal and to a second current source, and the emitters of said third and fourth transistors being coupled together and to a third current source, said output stage being coupled to said collectors of said first and second transistors and being a means for providing a logic compatible output responsive to the differential signal between said first and second resistors.

2. The sense amplifier of claim 1 wherein said first, second and third current sources are each resistors coupled to a fifth power supply terminal.

3. The sense amplifier of claim 1 wherein said first, second and third current sources are each substantially constant current transistor current means coupled to a fifth power supply terminal.

4. The sense amplifier of claim 1 further comprised of an inhibit means, said inhibit means being coupled to a sixth terminal and being a means for clamping said output in a predetermined logic state in response to an inhibit signal applied thereto, regardless of the condition of the input signals to said third and fourth terminals.

5. The sense amplifier of claim 4 wherein said inhibit means is a fifth transistor of the same conductivity type as said first, second, third and fourth transistors, the base of said fifth transistor being coupled to said sixth terminal, the collector of said fifth transistor being coupled to said collector of said fourth transistor, and the emitter of said fifth transistor being coupled to said third current source.

6. The sense amplifier of claim 1 wherein said first, second, third and fourth transistors are NPN transistors.

7. A sense amplifier comprising first, second, third, fourth, fifth, sixth, seventh, eighth and ninth transistors, all of said transistors being of the same conductivity type, and first, second and third resistors, said first and second transistors having their bases coupled together and to a first terminal and having their collectors coupled through said first and second resistors respectively to a second terminal, said collector of said first transistor further being coupled to the collector of said third transistor and said collector of said second transistor being coupled to the collector of said fourth transistor, the emitter of said first transistor being coupled to the base of said fourth transistor, to a third terminal, and to a first current source, the emitter of said second transistor being coupled to the base of said third transistor, to a fourth terminal and to a second current source, and the emitters of said third and fourth transistors being coupled together and to a third current source, the collectors of said fifth, seventh and eighth transistors being coupled to said second terminal, the collector of said sixth transistor being coupled to said second terminal through said third resistor, the bases of said fifth and eighth transistors being coupled to the collectors of said first and second transistors respectively, the emitters of said fifth and eighth transistors being coupled to fourth and fifth current sources respectively and to the bases of said sixth and seventh transistors respectively, the emitters of said sixth and seventh transistors being coupled together and to a sixth current source, said ninth transistor having its base coupled to the collector of said sixth transistor, its collector coupled to said second terminal, and its emitter coupled to a fifth terminal.

8. The sense amplifier of claim 7 further comprised of an inhibit means, said inhibit means being coupled to a sixth terminal and being a means for clamping the output at said fifth terminal in a predetermined logic state in response to an inhibit signal applied thereto, regardless of the condition of the input signals to said third and fourth terminals.

9. The sense amplifier of claim 8 wherein said inhibit means is a tenth transistor of the same conductivity type as said first through ninth transistors, the base of said tenth transistor being coupled to said sixth terminal, the collector of said tenth transistor being coupled to said collector of said fourth transistor, and the emitter of said tenth transistor being coupled to said third current source.

10. The sense amplifier of claim 7 wherein all of said transistors are NPN transistors.

* * * * *